United States Patent
Seki et al.

(10) Patent No.: US 6,442,043 B1
(45) Date of Patent: Aug. 27, 2002

(54) CHIP ASSEMBLY MODULE OF BUMP CONNECTION TYPE USING A MULTI-LAYER PRINTED CIRCUIT SUBSTRATE

(75) Inventors: Yoshihito Seki, Sakura; Masahiro Kaizu, Narita, both of (JP)

(73) Assignee: Fujikura Limited, Tokyo (JP)

( * ) Notice: Subject to any disclaimer, the term of this patent is extended or adjusted under 35 U.S.C. 154(b) by 0 days.

(21) Appl. No.: 09/635,338

(22) Filed: Aug. 9, 2000

(30) Foreign Application Priority Data

Aug. 11, 1999 (JP) ............................................ 11-227937
Aug. 11, 1999 (JP) ............................................ 11-227938

(51) Int. Cl.$^7$ ................................................ H05K 1/18
(52) U.S. Cl. ........................ 361/761; 361/719; 361/720; 361/764; 257/707; 257/706; 257/712; 174/252
(58) Field of Search .................................. 361/761, 764, 361/794, 749, 760, 777, 778, 779, 780, 719, 720; 430/312; 257/769, 660, 706, 707, 713, 712; 174/252

(56) References Cited

U.S. PATENT DOCUMENTS

| | | | | |
|---|---|---|---|---|
| 5,239,198 A | * | 8/1993 | Lin et al. ...................... | 257/693 |
| 5,646,828 A | * | 7/1997 | Degani et al. ............... | 361/715 |
| 5,672,548 A | | 9/1997 | Culnane et al. .............. | 437/209 |
| 5,737,191 A | * | 4/1998 | Horiuchi et al. ............. | 361/764 |
| 5,831,828 A | | 11/1998 | Cutting et al. ............... | 361/704 |
| 5,835,355 A | * | 11/1998 | Dordi .......................... | 361/760 |
| 5,923,535 A | | 7/1999 | Shimada et al. ............. | 361/749 |
| 5,945,741 A | * | 8/1999 | Ohsawa et al. .............. | 257/777 |
| 6,194,778 B1 | * | 2/2001 | Ohsawa et al. .............. | 257/668 |

FOREIGN PATENT DOCUMENTS

| | | | |
|---|---|---|---|
| JP | 60-94746 | 5/1985 | ........... H01L/23/32 |
| JP | 64-19737 | 1/1989 | ........... H01L/21/60 |
| JP | 2-73654 | 3/1990 | ........... H01L/23/02 |
| JP | 3-24740 | 2/1991 | ........... H01L/21/60 |
| JP | 3-81643 | 8/1991 | ......... H01L/23/522 |
| JP | 6-140466 | 5/1994 | ........... H01L/21/60 |
| JP | 2865072 | 12/1998 | ........... H01L/23/12 |
| TW | 85100714 | 7/1996 | |
| TW | 85111005 | 10/1997 | |
| TW | 86109739 | 10/1998 | |

OTHER PUBLICATIONS

Abstract 3–24742 A Feb. 1, 1991.
Patent Abstract of Japan 10092968 A Apr. 10, 1998.
Patent Abstract of Japan 06140466 A May 20, 1994.
Abstract 1–19737 A Jan. 23, 1989.
Abstract 2–73653 A Mar. 13, 1990.
Abstract 60–94745 A May 27, 1985.

* cited by examiner

*Primary Examiner*—David Martin
*Assistant Examiner*—Hung Bui
(74) *Attorney, Agent, or Firm*—Sughrue Mion, PLLC

(57) ABSTRACT

A multi-layer structured printed circuit substrate having an upper conductive layer and a lower conductive layer with an inter-layer insulating layer is used. A chip assembly part of bump connection type is formed by forming openings in a portion of the upper conductive layer and the inter-layer insulating layer in order to expose the lower conductive layer. A bear chip is buried in the chip assembly part for assembly. A sealing member is filled in the lower space of the bear chip. A flat plate type radiating plate having an opening corresponding to the chip assembly part is located on the substrate and a heat conductive adhesive is filled between the radiating plate and the bear chip.

11 Claims, 6 Drawing Sheets

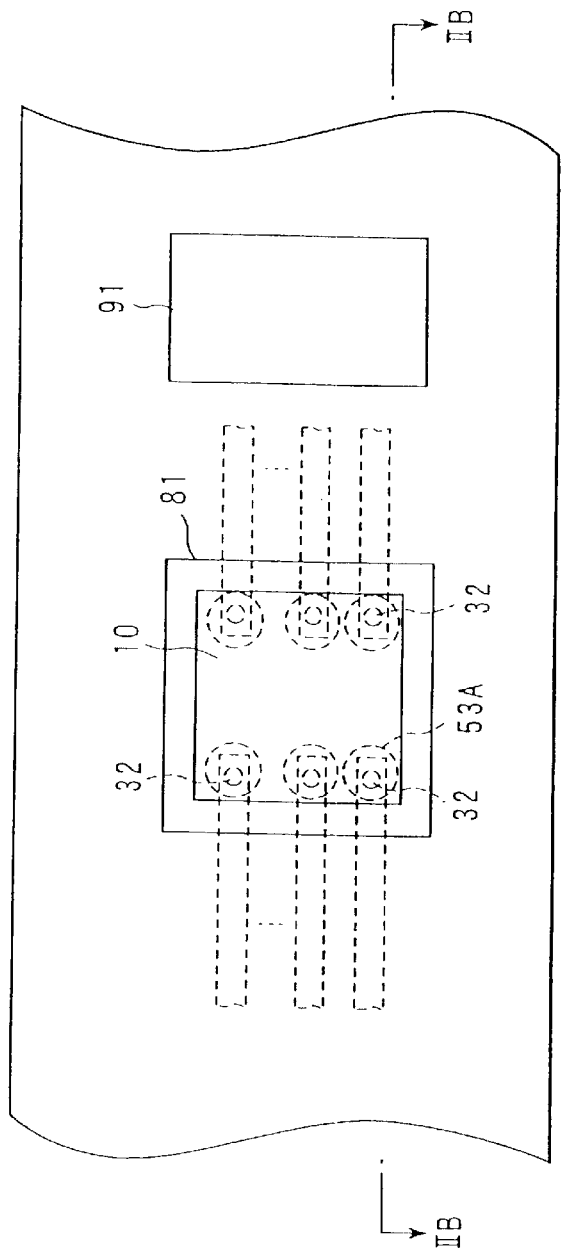
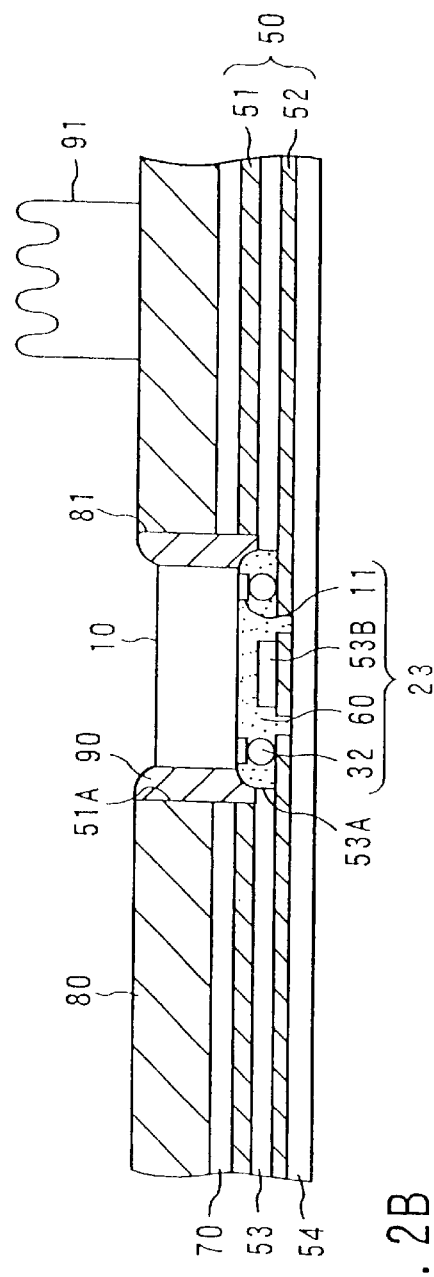
FIG. 2A
FIG. 2B

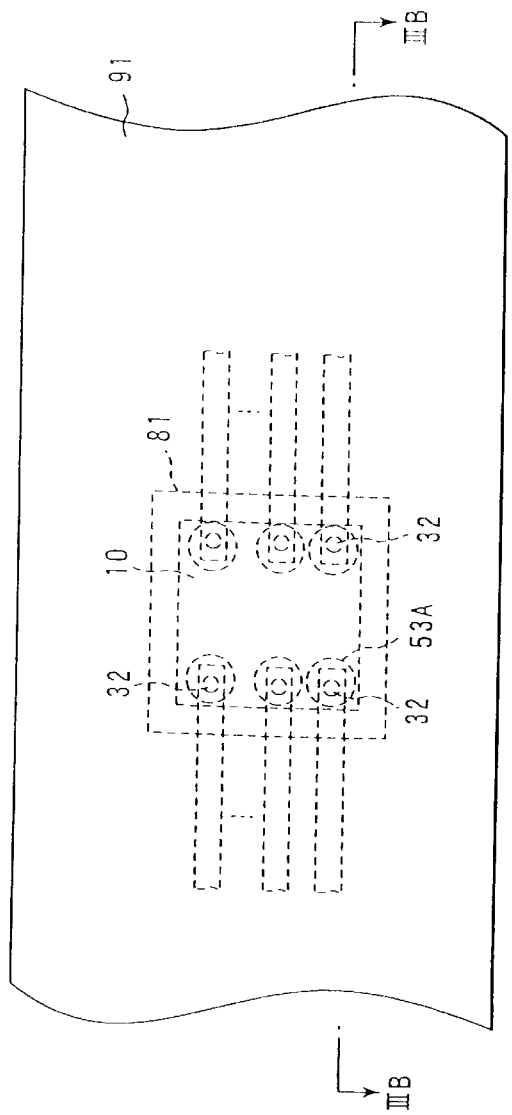
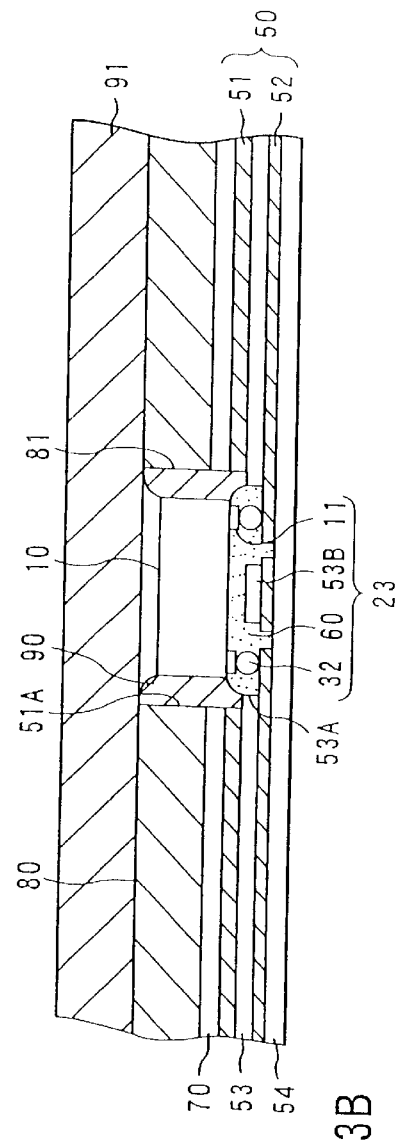
FIG. 3A
FIG. 3B

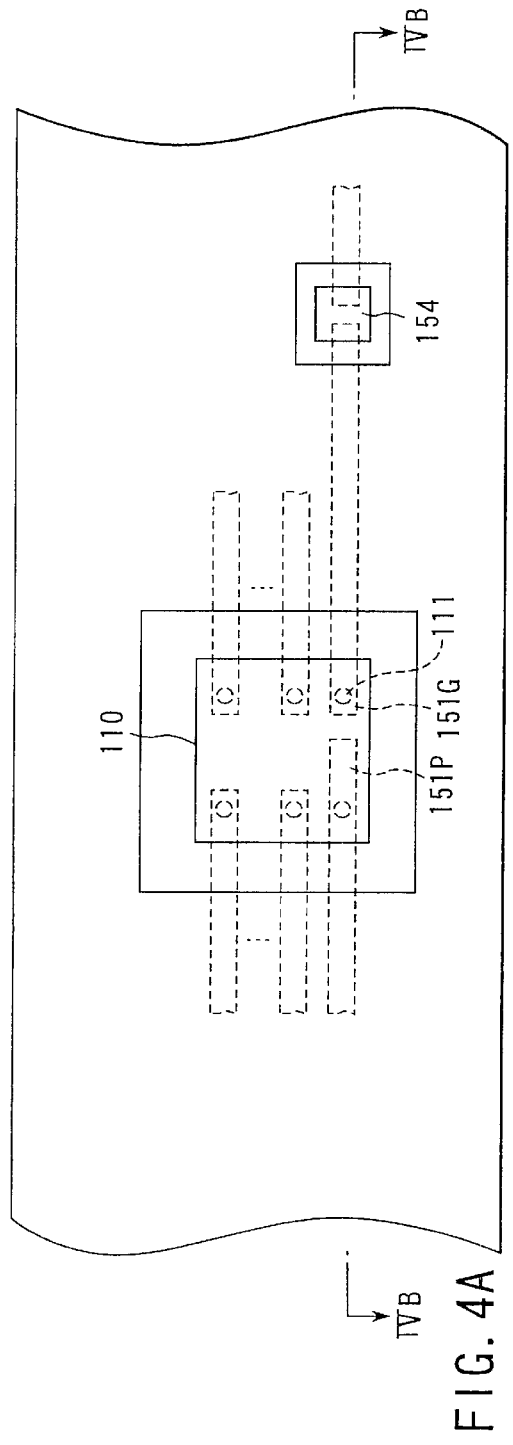
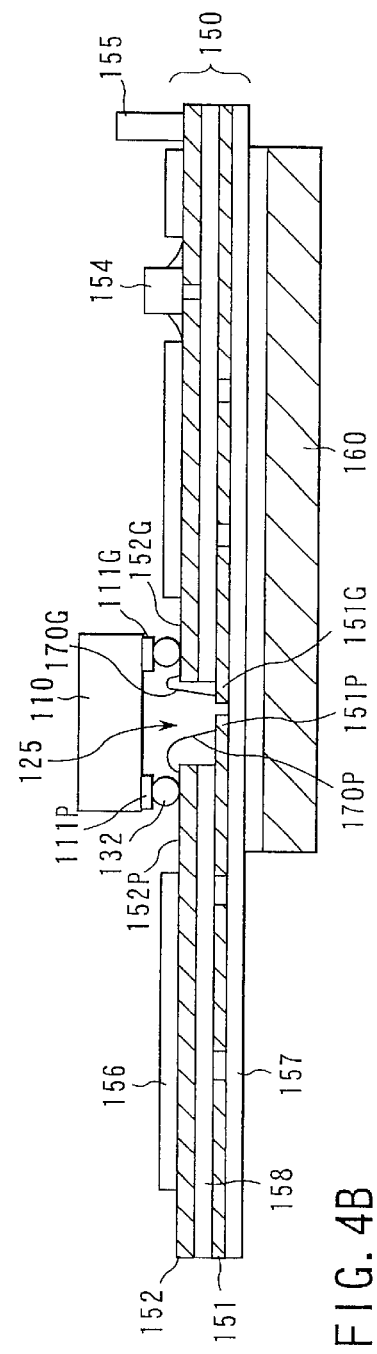
FIG. 4A
FIG. 4B

CHIP ASSEMBLY MODULE OF BUMP CONNECTION TYPE USING A MULTI-LAYER PRINTED CIRCUIT SUBSTRATE

CROSS-REFERENCE TO RELATED APPLICATIONS

This application is based upon and claims the benefit of priority from the prior Japanese Patent Applications No. 11-227937, filed Aug. 11, 1999; and No. 11-227938, filed Aug. 11, 1999, the entire contents of which are incorporated herein by reference.

BACKGROUND OF THE INVENTION

Conventionally, when LEI parts are assembled on a flexible printed circuit (FPC) substrate, a COB (chip on board) method has been mainly used, wherein an IC bear chip 10 is located on a FPC substrate 20 with an electrode 11 thereof upward, the chip electrode 11 and a FPC substrate electrode 21 are wire-bonded with each other by means of an Au wire 30, and subsequently the whole body is sealed by means of a resin 31, as shown in the cross-sectional view of FIG. 6.

On the other hand, recently a bump connection method such as BGA (ball grid array), CSP (chip sized package), flip chip and the like having an electrode on the lower side thereof has been increasingly employed. FIG. 7 is a cross-sectional view showing an example thereof. The bear chip 10 is located on the lower surface with the electrode 11 downward, and is connected with the electrode 21 of the FPC substrate 20 with a bump 32 such as a ball or the like therebetween.

In a flip chip assembly method, since the substrate electrodes 21 must be opposed to each other in the same pitch as the IC electrode 11, it is indispensable to form a fine pattern. However, when a double-sided (two-layer) type substrate is used as the FPC substrate 20, and a chip is assembled on a front surface (upper layer) circuit pattern, an uneven rear surface (lower layer) circuit pattern influences also the front surface circuit. Therefore, it is usual to make the rear surface circuit portion on the chip assembly part a solid pattern land by means of the widest Cu circuit possible. However, it is difficult in design to bypass such an extremely wide solid pattern circuit portion and to draw out a fine pattern.

Moreover, in order to prevent short circuit between the electrodes, a solder resist is used around the connection portion between the chip and the circuit pattern in the chip assembly part, and due to a fine pattern this raises difficult problems in the production process including the selection of a resist material and the discussion of an applying method.

Moreover, in the flip chip assembly, the rear surface of the IC chip 10 looks upward and is exposed in the highly heat-insulating air, what is disadvantageous with respect to the radiating characteristics. Therefore, conventionally a radiating part such as a radiating fin or the like is bonded on the rear surface of the IC chip 10 by means of a heat-conductive adhesive in order to improve the radiation property. However, the method of bonding a radiating part on the chip causes the deformation or destruction of the assembly part due to a mechanical stress applied to the chip itself and to the assembly part on the lower surface thereof by the gravity of the radiating part.

In a COB method shown in FIG. 6, wire bonding is possible at any position where a wire loop of the Au wire 30 can be formed. So, the signal line from the LSI pad and the power source and ground lines can be connected separately to the substrate side so that the electric characteristics of the assembly module may become advantageous.

FIG. 8 is a cross-sectional view showing an example thereof. There are two kinds of substrates used in this chip assembly module, and the one is a single-sided FPC substrate 20 applied to the output side drawing out a signal line in a fine pitch. The other is a double-sided RPC substrate 40 applied to the input side requiring a power source line and a ground line to be drawn in a thick pattern. The single-sided FPC substrate 20 is fabricated by integrating upper and lower two-layer insulating films 23 and 24 with a conductive circuit pattern 22 therebetween. RPC double-sided substrate 40 is fabricated by forming upper and lower two-layer conductive patterns 41 and 42 in an insulating board 43. These substrates 20 and 40 are bonded at a bonding part 33.

In a bump connection method shown in FIG. 7, the substrate electrodes must be also opposed to each other in the same order as in bump array (LSI pad array), and an equal pitch pattern must be formed on the substrate. However, there are difficulties in realizing this. Particularly, in the flip chip assembly, it is difficult to form a fine pattern and to isolate a signal line, a power source line and a ground line from each other. In a COB assembly structure shown in FIG. 8, there are no such problems, however, this structure can not be applied to the bump connection method requiring a flat chip assembly pat. Moreover, by using the RPC double-sided substrate 40, there is an increase in cost.

BRIEF SUMMARY OF THE INVENTION

Therefore, one object of the present invention is to provide a chip assembly module of bump connection type being capable of being made thin as a whole and also being capable of radiating heat efficiently from the assembled chip.

Another object of the present invention is to provide a chip assembly module of bump connection type having superior electric characteristics and being capable of performing a high density assembly by using only a FPC double-sided substrate.

According to the present invention, a chip assembly module is provided, comprising:

a multi-layer structured printed circuit substrate having at least an upper conductive layer and a lower conductive layer with an inter-layer insulating layer and having a chip assembly part formed thereon;

a chip having a bump part formed therein which is assembled in the chip assembly part of the printed circuit substrate by means of bump connection method; and a flat plate type radiating plate located on the printed circuit substrate, wherein the chip assembly part is formed by forming a chip opening corresponding to the chip on the upper conductive layer, forming a bump opening corresponding to the bump part of the chip on the inter-layer insulating layer exposed from this chip opening, and exposing the lower conductive layer from this opening, and the chip is buried in the chip opening of the chip assembly part and assembled so that the upper surface thereof may protrude from the upper conductive layer;

the radiating plate has substantially the same opening as the chip opening of the chip assembly part, and it also has such a thickness as the upper surface thereof is only a little higher than the upper surface of the chip assembled in the chip assembly part; and a heat conductive adhesive is filled between the inner wall of the opening of the radiating plate and the side of the chip.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A and 2B are a plan view and a cross-sectional view of a chip assembly module according to a first variant of the first embodiment of the present invention respectively;

FIGS. 3A and 3B are a plan view and a cross-sectional view of a chip assembly module according to a second variant of the first embodiment of the present invention respectively;

FIGS. 4A and 4B are a plan view and a cross-sectional view of a chip assembly module according to a second embodiment of the present invention respectively;

DETAILED DESCRIPTION OF THE INVENTION

Figure 1A:
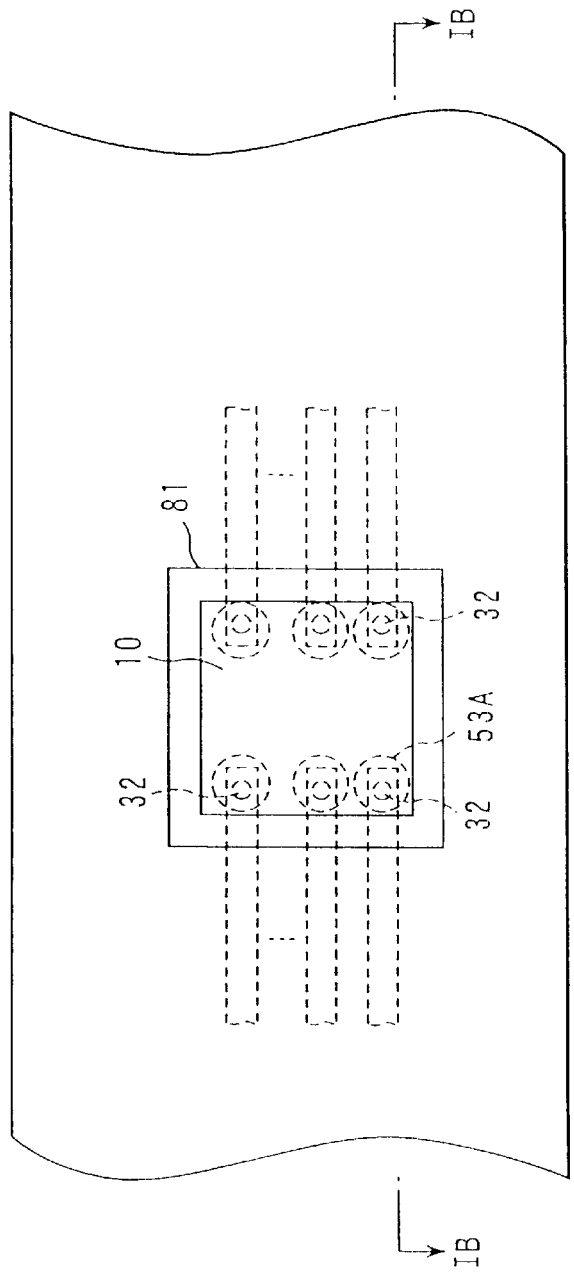
FIGS. 1A and 1B are a plan view and a cross-sectional view of a chip assembly module according to a first embodiment of the present invention respectively.
Figure 1B:
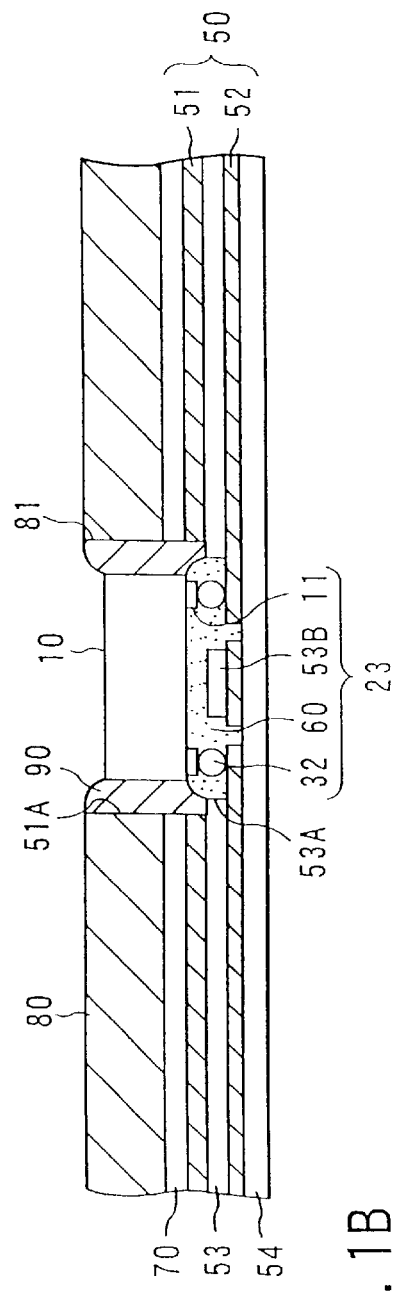

Now, the present invention will be described in detail with reference to the embodiments shown in the drawings. FIG. 1A is a plan view of a chip assembly module according to first embodiment of the present invention, and FIG. 1B is a cross-sectional view along the line I—I in FIG. 1A. In the chip assembly module of this embodiment, a double-sided (two-layer) FPC substrate 50 having an upper conductive pattern layer 51 and a lower conductive pattern layer 52 is used.

The double-sided FPC 50 is formed by integrating the upper conductive layer 51 and the lower conductive layer 52 with an inter-layer insulating layer 53 therebetween and also with a rear surface insulating layer 54 under the lower conductive layer. The material of the insulating layers 53 and 54 is a resin such as polyimide or the like.

By etching a portion of the upper conductive layer 51 on this double-sided PPC substrate, a chip opening 51A corresponding to the outer diameter of the chip 10 is formed. Subsequently, on the inter-layer insulating layer 53 an opening 53A corresponding to the bump 32 of the chip 10 is formed by means of laser beam machining. The surface of the portion of the lower conductive layer exposed by the bump opening 53A is treated by means of surface treatment such as plating or the like so that it may be used as a land for connecting the bump. And the inter-layer insulating layers 53 and 53B around the bump opening 53A, that is, the unopened portions function as a resist having an uniform thickness.

The bear chip 10 having electrode 11 located downwardly on its lower surface is connected via the bump 32 to the chip assembly part 23. The bear chip 10 is typically a flip chip. The lower space of the bear chip 10 is filled with a sealing compound 60, for example, epoxy resin, in order to improve environment resistance. Since the inter-layer insulting layer 53B remains in the lower space of the bear chip 10, the filling amount of the sealing compound 60 can be reduced thanks to this inter-layer insulating layer 53B. Moreover, a SMD (surface mount device) such as a bypass capacitor or the like can be located in the chip opening 51A.

On the upper side of the FPC substrate 50 a flat plate type radiating plate 80 is located via a bonding sheet 70. The radiating plate 80 is made, for example, of Al material and has an opening 81 corresponding to the chip assembly part 23. Between the inner wall of this radiating plate opening 81 and the side of the chip 10 a heat conductive adhesive 90 such as silicone or the like is filled. This heat radiating structure radiates heat from the chip 10 to the radiating plate 80 via the adhesive 90. Accordingly, since there are no radiating parts applying stress on the chip 10, the bear chip 10 and the chip assembly part 23 are not deformed or destructed. Moreover, the sealing compound 60 maintains the reliability of the IC assembly itself, the adhesive 60 can be selected only in view of the heat conductivity thereof.

The surface of the radiating plate 80 is set so as to be only a little higher than the upward surface of the chip 10 (the rear surface of the chip). Therefore, the chip 10 is fully buried in the chip assembly part 23 and the whole body can be made thin.

Moreover, as shown in FIGS. 2A and 2B, a secondary radiating part 91 such as a radiating fin may be located on the radiating plate 90 so that they may come closely into contact. Since this secondary radiating part 91 is located in a position off to the transverse direction, no stress is applied to the chip 10 and the chip assembly part 23.

Alternatively, a secondary radiating plate 91 may be placed on the radiating plate 80 with completely covering the chip 10, as shown in FIGS. 3A and 3B. This structure will surely prevent an inadvertent access to the chip 10 at a time of module attachment.

The bump connection method applicable to the chip assembly part may be not only a flip chip type, but also a ball grid array type or a chip size package type. The chip assembly module according to the present invention can be applied to, for example, PDPs (plasma display panels) which require miniaturization and thinning, are driven by high voltage and have a high heating value. It can be also applied to high voltage and high density bump assembled items (flip chip assembled items). Moreover, as multi-layer printed circuit substrate, not only a FPC but also a RPC (rigid printed circuit) substrate can be used.

The above-described chip assembly module according to the first embodiment of the present invention has following advantages:

(1) Since the chip is buried in the inside of the substrate, the whole module is reduced in weight and miniaturized (in particular, made thin);

(2) Since it is not necessary to form a resist layer corresponding to a fine pattern, the fabrication process is simplified;

(3) Heat can be radiated without locating a radiating part on the chip and the chip assembly part;

(4) By locating the surface of the radiating plate only a little higher than the upward surface of the IC chip, a secondary radiating plate can be attached more easily.

Now, a second embodiment of the present invention will be described.

FIG. 4A is a plan view of a chip assembly module according to a second embodiment of the present invention, and FIG. 4B is a cross-sectional view along the line III—III in FIG. 4A. The chip assembly module of this embodiment includes a double-sided FPC substrate having an upper layer conductive pattern 152 forming a signal line and also having a lower layer conductive pattern 151 forming a power source line and a ground line, and it also includes a bear chip 110 assembled therein.

The double-sided FPC 150 is formed by integrating the lower layer conductive pattern 151 and the upper layer conductive pattern 152 between upper and lower two-layer insulating films 156 and 157 with an intermediate layer insulating film 158 therebetween. On the upper layer conductive pattern 152 a surface mounting part 154 is assembled. Moreover, a connector 155 is attached thereto.

By removing a portion of the upper insulating film 156 on this double-sided FPC substrate 150 by means of laser beam machining and by exposing a portion of the upper layer conductive pattern 152, a chip assembly part 125 of bump connection type is formed. Moreover, by removing a portion of the intermediate layer insulating film 158 by means of laser beam machining, a portion of the lower layer conductive pattern 151 located below the chip assembly part 125 is exposed. Moreover, in the lower layer conductive pattern 151 lower layer electrode parts 151P and 151G are formed separated and independently from each other in advance.

The bear chip 110 is assembled in the chip assembly part 125 via a bump 132. Upper electrode parts 152P and 152G for power source and ground of the upper layer conductive pattern 152 connected to a pad 111P for power source and a pad 111G for ground respectively are connected to lower electrode parts 151P and 151G for power source and ground of the lower layer conductive pattern 151 respectively via Au bonding wires 170P and 170G (connection parts).

A sealing compound (not shown), for example, epoxy resin is filled around the chip assembly part 125 and the bonding wires 170 in order to improve environment resistance. The double-sided FPC substrate 150 is reinforced by means of a metallic stiffener 160 which is placed on either the rear surface of the double-sided FPC substrate 150 which is opposite to the chip assembly part 125 or the front surface of the double-sided FPC substrate 150 which is the same side as the chip assembly part 125. The bear chip is typically a flip chip type.

The bump connection method applicable to the chip assembly part may be not only a flip chip type, but also a ball grid array type or a chip size package type.

Figure 5:
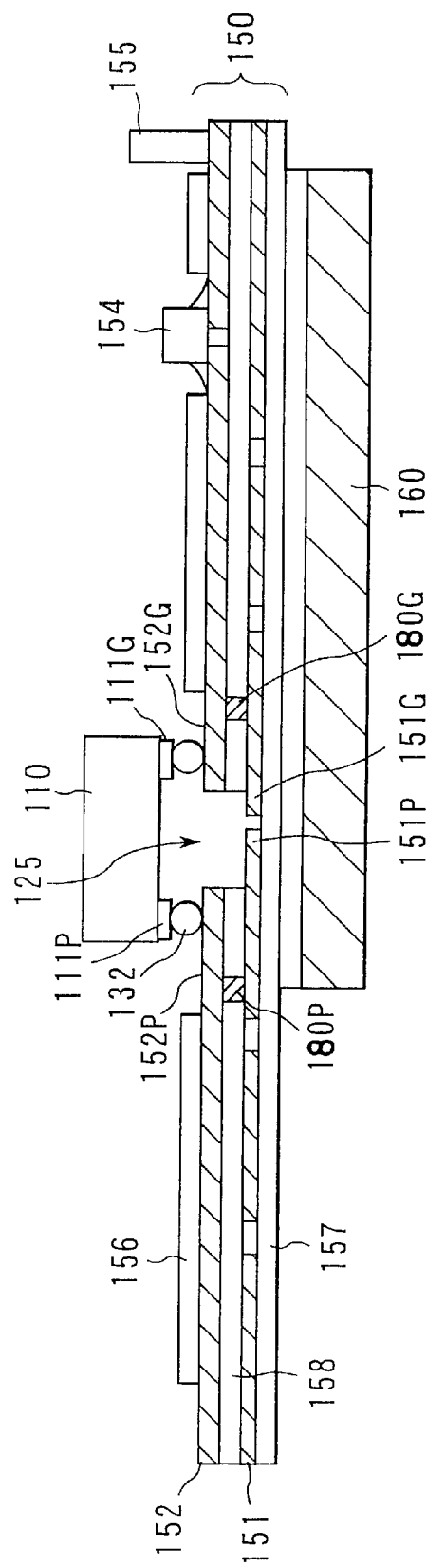
FIG. 5 is a cross-sectional view of a chip assembly module according to a variant of the second embodiment of the present invention respectively.
Figure 6:
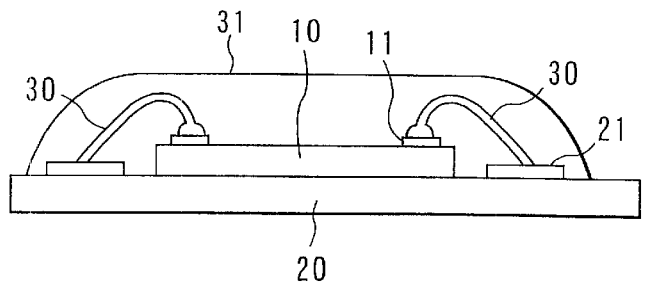
FIG. 6 is a cross-sectional view showing a chip assembly according to the conventional COB method.
Figure 7:
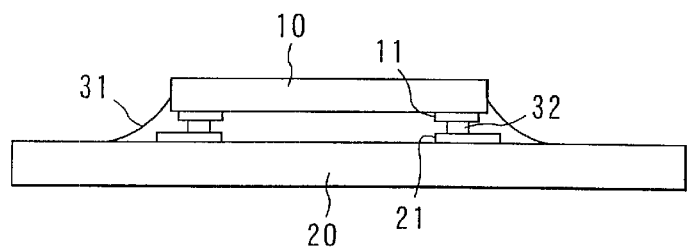
FIG. 7 is a cross-sectional view showing a chip assembly according to the conventional bump connection method.
Figure 8:
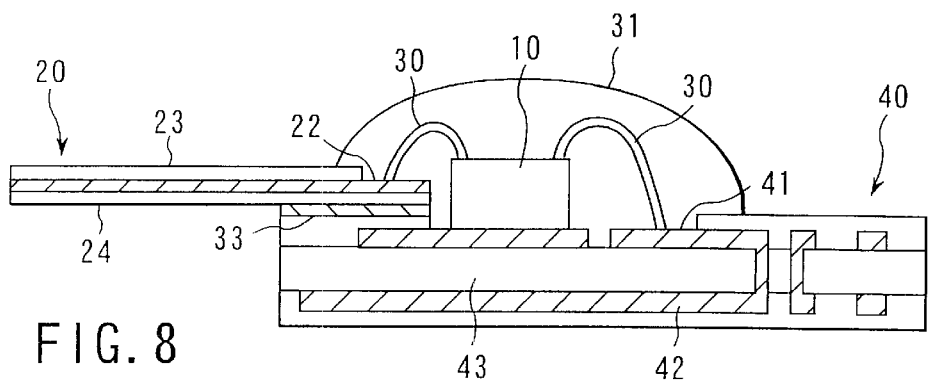
FIG. 8 is a cross-sectional view showing a conventional chip assembly using a stepped substrate.

The connection part connecting the upper layer conductive pattern 152 and the lower layer conductive pattern 151 with each other may use through-holes as shown in FIG. 5 other than the above-described wire bonding. That is, the upper layer electrode part 152P for power source and the upper layer electrode part 152G for ground may be connected with the lower layer electrode part 151P for power source and the lower layer electrode part 151G for ground respectively by means of through-holes 180P and 180G extending from the upper layer to the lower layer.

The double-sided FPC substrate 150 is reinforced by means of a metallic stiffener 160 which is placed on either the rear surface of the double-sided FPC substrate 150 which is opposite to the chip assembly part 125 or the front surface of the double-sided FPC substrate 150 which is the same side as the chip assembly part 125.

Such a chip assembly module can be applied to electronic devices of which miniaturization and thinning are required, for example, to PDPs (plasma display panels). It can be also applied to high voltage and high density bump assembled items (flip chip assembled items). Moreover, with respect not only to a power source line and a ground line, but also to a high density signal line, by connecting to the lower layer conductive pattern (rear surface circuit) in order to reduce the wiring density, the difficulty in forming a circuit of the upper conductive pattern (front surface circuit) can be reduced.

The above-described chip assembly module according to the present invention has following advantages:

(1) By using a double-sided substrate for assembly a flip chip and by exposing a lower layer conductive electrode in the lower portion of the chip, a power source line and a ground line can be formed in the lower layer conductive pattern, and by isolating them from a signal line in the upper layer conductive pattern, improvement in electric characteristics such as noise reduction can be attained;

(2) Since the upper and lower conductive patterns can draw a circuit pattern freely except in the chip assembly part, a wiring substrate (module) can be miniaturized in comparison with the conventional structure in which a single-sided substrate and a double-sided substrate are bonded together; and (3) It is not necessary to use expensive RPC double-sided substrates, and a reduction in cost can be attained by using only FPC substrates.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A chip assembly module comprising:

a multi-layer structured printed circuit substrate having at least an upper conductive layer and a lower conductive layer with an inter-layer insulating layer and having a chip assembly part formed thereon;

a chip having a bump part formed therein which is assembled in the chip assembly part of said printed circuit substrate by means of bump connection method; and a flat plate type radiating plate located on said printed circuit substrate, wherein said chip assembly part is formed by forming a chip opening corresponding to said chip on said upper conductive layer, forming a bump opening corresponding to the bump part of said chip on said inter-layer insulating layer exposed from this chip opening, and exposing said lower conductive layer from this opening, and said chip is buried in the chip opening of said chip assembly part and assembled so that the upper surface thereof may protrude from said upper conductive layer;

said radiating plate has substantially the same opening as the chip opening of said chip assembly part, and it also has such a thickness as the upper surface thereof is only a little higher than the upper surface of said chip assembled in said chip assembly part; and a heat conductive adhesive is filled between the inner wall of the opening of said radiating plate and the side of said chip.

2. The chip assembly module according to claim 1, wherein a lower space of said chip assembly part is filled with a sealing compound.

3. The chip assembly module according to claim 1, wherein the surface of said lower conductive layer exposed by means of said bump opening is treated by means of surface treatment so that it may be used as a land for connecting the bump.

4. The chip assembly module according to claim 1, wherein a secondary radiating part is located on said radiating plate.

5. The chip assembly module according to claim 1, wherein a secondary radiating part is placed on the radiating plate with completely covering the chip.

6. A chip assembly module comprising:

a double-sided flexible printed circuit substrate having an upper layer conductive pattern forming mainly a signal line, a lower layer conductive pattern forming mainly a power source line and a ground line, and a chip assembly part of bump connection type where the upper layer conductive pattern is partly exposed;

the upper layer conductive pattern and the lower layer conductive pattern of the double-sided flexible printed circuit substrate are covered with an upper insulating film and a lower insulating film, respectively, and the chip assembly part causes the upper layer conductive pattern to be partly exposed by removing a part of the upper insulating film;

a bear chip assembled in the chip assembly part of said double-sided flexible printed circuit substrate; and a connection means connecting the upper layer conductive pattern and the lower layer conductive pattern on said flexible printed circuit substrate with each other.

7. The chip assembly module according to claim 6, wherein a stiffener is placed on at least either the rear surface of the double-sided flexible printed circuit substrate which is opposite to the chip assembly part or the front surface of the double-sided flexible printed circuit substrate which is the same side as the chip assembly part.

8. A chip assembly module comprising:

a double-sided flexible printed circuit substrate having an upper layer conductive pattern forming mainly a signal line, a lower layer conductive pattern forming mainly a power source line and a ground line, and a chip assembly part of bump connection type where the upper layer conductive pattern is partly exposed;

a bear chip assembled in the chip assembly part of said double-sided flexible printed circuit substrate; and a connection means connecting the upper layer conductive pattern and the lower layer conductive pattern on said flexible printed circuit substrate with each other and wherein in said double-sided printed circuit substrate the upper layer electrode parts for power source and ground of said bear chip are formed in the upper layer conductive pattern composing said chip assembly part, and the lower layer electrode parts for power source and ground are formed by exposing a portion of said lower layer pattern located below said chip assembly part; and said connection means comprises bonding wires connecting said upper layer electrode parts and lower electrode parts with each other.

9. The chip assembly module according to claim 8, wherein a stiffener is placed on at least either the rear surface of the double-sided flexible printed circuit substrate which is opposite to the chip assembly part or the front surface of the double-side flexible printed circuit substrate which is the same side as the chip assembly part.

10. A chip assembly module comprising:

a double-sided flexible printed circuit substrate having an upper layer conductive pattern forming mainly a signal line, a lower layer conductive pattern forming mainly a power source line and a ground line, and a chip assembly part of bump connection type where the upper layer conductive pattern is partly exposed;

a bear chip assembled in the chip assembly part of said double-sided flexible printed circuit substrate; and a connection means connecting the upper layer conductive pattern and the lower layer conductive pattern on said flexible printed circuit substrate with each other and wherein in said double-sided printed circuit substrate the upper layer electrode parts for power source and ground of said bear chip are formed in the upper layer conductive pattern composing said chip assembly part, and the lower layer electrode parts for power source and ground arc formed by exposing a portion of said lower layer patter located below said chip assembly part; and said connection means comprises though-holes connecting said upper layer electrode parts and lower electrode parts with each other.

11. The chip assembly module according to claim 10, wherein a stiffener is placed on at least either the rear surface of the double-sided flexible printed circuit substrate which is opposite to the chip assembly part or the front surface of the double-side flexible printed circuit substrate which is the same side as the chip assembly part.

* * * * *